(12) United States Patent
Kabat et al.

(10) Patent No.: US 6,796,818 B2
(45) Date of Patent: Sep. 28, 2004

(54) EXTENDER CARD WITH INSERTION/REMOVAL ARRANGEMENT

(75) Inventors: Zbigniew Kabat, Schaumburg, IL (US); Andrew J. Karkowski, Carol Stream, IL (US); James C. Budzynski, North Aurora, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/225,645

(22) Filed: Aug. 21, 2002

(65) Prior Publication Data

US 2004/0038571 A1 Feb. 26, 2004

(51) Int. Cl.⁷ .............................................. H01R 13/62
(52) U.S. Cl. ....................... 439/160; 439/945; 439/912
(58) Field of Search ................................ 439/160, 945, 439/912, 157; 361/796

(56) References Cited

U.S. PATENT DOCUMENTS

| | | | | |
|---|---|---|---|---|
| 3,710,194 A | * | 1/1973 | Zammit et al. .............. | 361/796 |
| 3,764,857 A | * | 10/1973 | Bartlett et al. .............. | 439/160 |
| 3,958,858 A | | 5/1976 | Silveira, Jr. | |
| 4,319,305 A | * | 3/1982 | Meldrum ..................... | 361/796 |
| 5,101,320 A | * | 3/1992 | Bhargava et al. ........... | 361/796 |
| 5,163,219 A | | 11/1992 | Akulow et al. | |
| 5,967,814 A | * | 10/1999 | Sikorski, Jr. ................ | 439/945 |
| 6,021,049 A | * | 2/2000 | Thompson et al. ......... | 439/160 |
| 6,582,241 B1 | * | 6/2003 | Lutz, Jr. ...................... | 439/160 |

* cited by examiner

Primary Examiner—Briggitte R. Hammond
(74) Attorney, Agent, or Firm—David J. Zwick; Steven R. Santema

(57) ABSTRACT

An extender card arrangement having ejector levers attached to the unitary card portion of an extender card to aid in the insertion and removal of the extender card into and from a backplane, and having ejector lever brackets attached to the extender card card guides to allow the ejector levers on a card under test to be used to aid in the insertion and removal of the card under test into and from the extender card.

2 Claims, 3 Drawing Sheets

EXTENDER CARD WITH INSERTION/REMOVAL ARRANGEMENT

FIELD OF THE INVENTION

The present invention relates to test adapters, and more particularly to test adapters for the dynamic testing of printed circuit boards.

BACKGROUND OF THE INVENTION

Most electrical and electronic systems typically comprise a set of closely stacked printed circuit boards fitted vertically into backplanes or card cage areas. Performing dynamic maintenance or testing functions on these cards, sometimes referred to as "hot testing", can be very difficult due to the presence of adjacent cards on either side of the card under test having very tight clearances between the adjacent cards.

To aid in testing or maintenance of printed circuit boards, test adapters commonly referred to as "extender cards" are used. Extender cards typically comprise a unitary card portion that is substantially the same size as the board under test, having electrical connectors on opposite edges that are connected in a "straight across" manner. Extender cards also typically comprise card guides attached to the rear upper and lower edges of the unitary card portion.

The card under test is removed from the backplane and the front of the extender card opposite the card guides is plugged into the backplane in its place. The extender card carries all of the appropriate connections from the backplane to the extender card's rear edge where the rear connector is available, and the card under test is plugged into the rear connector via the card guides. With the extender card plugged into the backplane and the card under test inserted into the extender card, the card under test is available with both sides open to a craftsperson wishing to work on the card.

In general, the extender card has no active components to provide processing or programming capabilities, and serves simply to provide more convenient access to a circuit card. Special purpose extender cards may provide processing or programming capabilities.

Typically, when a circuit card is plugged into a backplane, mechanical assists, usually in the form of ejector levers on the card, assist in the insertion and removal of the card from the backplane connector. In use, the ejector levers on the cards mate with ejector lever brackets on the card cage or module. The ejector levers allow the craftsperson to easily and smoothly overcome the retention and insertion forces on card removal and insertion, even though these forces can be quite large for, for example, a large format 330 or 440 pin card. Use of the ejector levers also allows the circuit cards to be inserted and removed straight in and straight out, which eliminates damage to the circuit card, the circuit card pins and the backplane connector pins that may be caused by, for example, rocking the card back and forth on insertion or removal.

While circuit cards, particularly large format circuit cards, typically have ejector levers to assist in the insertion and removal of the card into and out of the backplane, extender cards do not. The extender cards are manually inserted with no mechanical assists, which can cause damage to the extender card, the extender card pins, and the backplane connector pins. U.S. Pat. No. 3,958,858 even teaches to use the card guides on the extender card to insert the extender card into the backplane, which can lead to additional damage to the extender card and card guides.

The typical extender card also does not have ejector lever brackets on the card guides to allow for the use of ejector levers on circuit cards under test during the insertion and removal of the circuit card into and from the extender card. This can cause damage to the circuit card, the extender card and the card guides.

SUMMARY OF THE INVENTION

Accordingly, it is an object of the present invention to provide an extender card having ejector levers and ejector lever brackets in a manner that will eliminate damage to the extender card and the circuit card under test due to the insertion and removal of the extender card into and from the backplane, and the circuit card into and from the extender card.

The present invention is an extender card arrangement having ejector levers attached to the unitary card portion of the extender card to aid in the insertion and removal of the extender card into and from the backplane, and having ejector lever brackets attached to the extender card card guides to allow the ejector levers on the card under test to be used to aid in the insertion and removal of the card under test into and from the extender card.

DESCRIPTION OF THE PREFERRED EMBODIMENT

Figure 1:
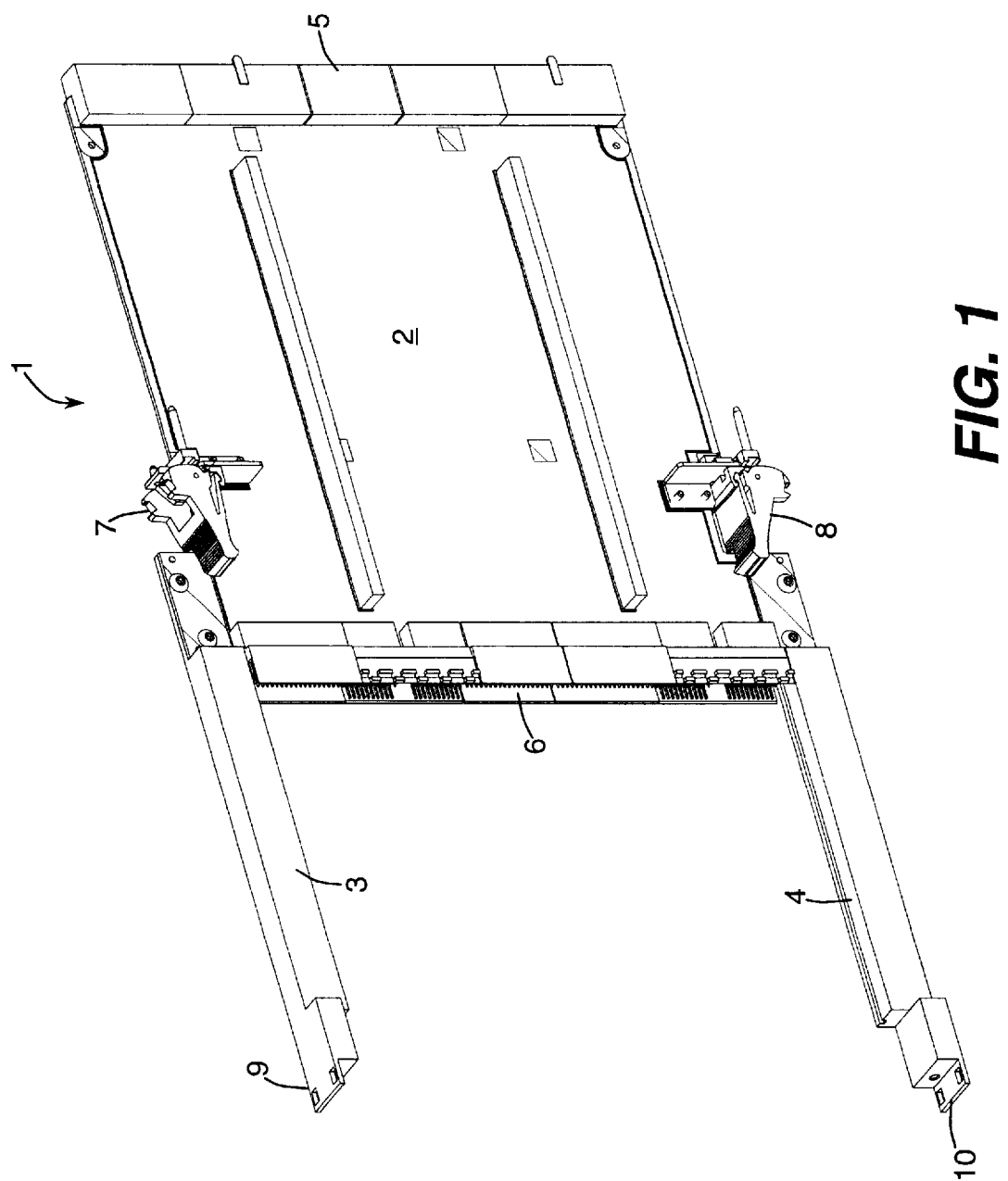
FIG. 1 shows a preferred embodiment of the extender card of the present invention.

FIG. 1 shows a preferred embodiment of the extender card of the present invention. Extender card 1 comprises a unitary card portion 2 having a connector 5 at its front edge, and a connector 6 at the opposite rear edge. Upper and lower card guides 3 and 4, respectively, attach to the rear of the upper and lower edges of unitary card portion 2, and extend rearward from unitary card portion 2. Upper and lower ejector levers 7 and 8, respectively, are attached to the upper and lower edges of unitary card portion 2 forward of upper and lower card guides 3 and 4. Specific placement of upper and lower ejector levers 7 and 8 is dependent on the card cage geometry and architecture. Upper and lower ejector lever brackets 9 and 10, respectively, are at the distal ends of card guides 3 and 4, respectively. Ejector lever brackets 9 and 10, as shown, are integral to card guides 3 and 4, respectively, but may also be discrete elements that are attached to card guides 3 and 4 in any appropriate manner known to the art.

In the preferred embodiment, the geometries of ejector levers 7 and 8 and ejector lever brackets 9 and 10 are governed by the Institute of Electrical and Electronics Engineers, Inc. standard 1101.10-1996, "IEEE Standard for Additional Mechanical Specifications for Microcomputers Using the IEEE 1101.1-1991 Equipment Practice", 1996, IEEE. Other known or proprietary geometries may also be used without departing from the scope of the invention.

For purposes of illustration, the preferred embodiment describes the card under test and the extender card as part of a card cage arrangement. Generally, the extender card of the present invention may be advantageously used with any multi- or single-card arrangement where the card under test is inserted into a connector, and ejector levers on the card mate with ejector lever brackets on the card arrangement.

Figure 2:
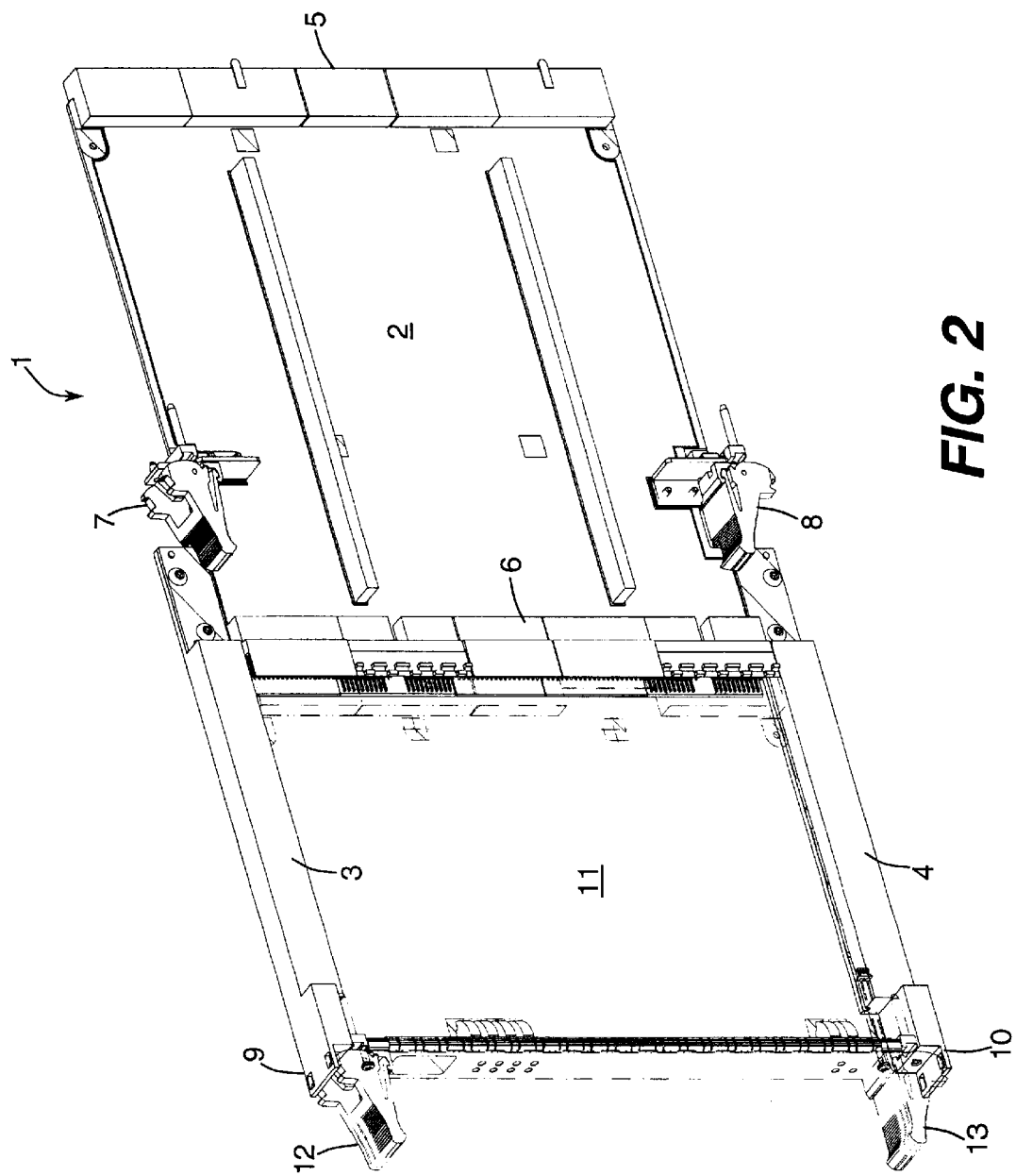
FIG. 2 shows a shows a preferred embodiment of the extender card of the present invention with a card under test inserted into the extender card.

FIG. 2 shows a preferred embodiment of the extender card of the present invention with a card under test 11 inserted into the extender card 1. Card under test 11 is inserted into rear connector 6 via card guides 3 and 4 with the use of ejector levers 12 and 13. Ejector levers 12 and 13 on card under test 11 mate with ejector lever brackets 9 and 10 on card guides 3 and 4, respectively, and aid in the insertion and removal of card under test 11 into and from rear connector 6 of extender card 1.

Figure 3:
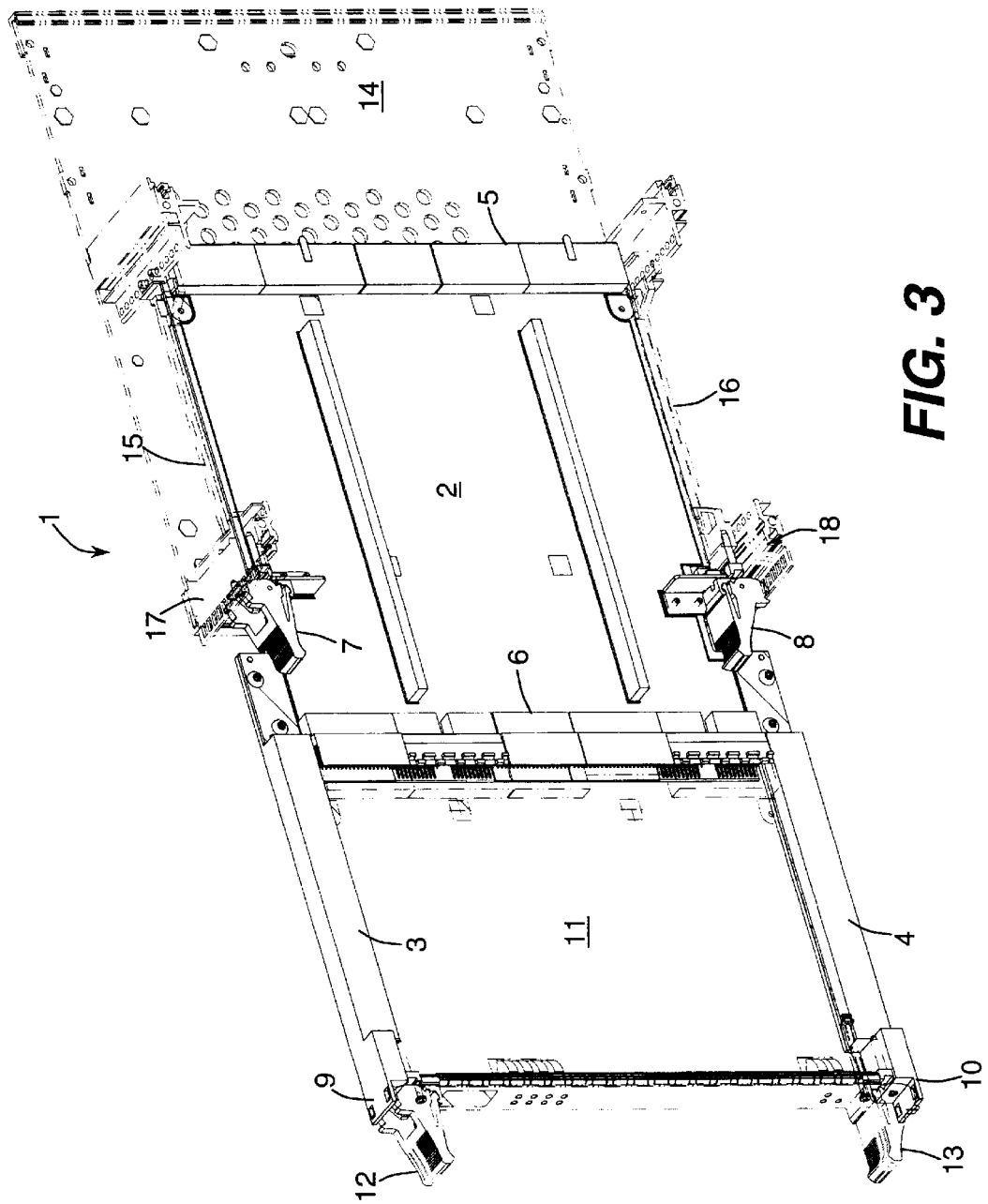
FIG. 3 shows a shows a preferred embodiment of the extender card of the present invention with a card under test inserted into the extender card, and the extender card inserted into a card cage slot.

FIG. 3 shows a preferred embodiment of the extender card of the present invention with the card under test 11 inserted into extender card 1, and extender card 1 inserted into a card cage slot. Unitary card portion 2 is inserted into a card cage slot of card cage 14 via card cage card guides 15 and 16 with the use of ejector levers 7 and 8 on unitary card portion 2. Ejector levers 7 and 8 mate with ejector lever brackets 17 and 18, respectively, on card cage card guides 15 and 16, respectively, and aid in the insertion and removal of unitary card portion 2 of extender card 1 into and from the card cage slot of card cage 14.

While the inventive system has been particularly shown and described, it is not intended to be exhaustive nor to limit the invention to the embodiment disclosed. It will be apparent to those skilled in the art that modifications can be made to the present invention without departing from the scope and spirit thereof. For example, the specific geometries of the card cage, cards, levers and brackets can be governed by any suitable public or private standard. While the preferred embodiment describes the invention in the context of a backplane or card cage arrangement, the invention may be advantageously used with any multi- or single-card arrangement where the card under test is inserted into a connector, and ejector levers on the card mate with ejector lever brackets on the card arrangement. For brevity, the term card cage as used in the claims should be construed to cover any such multi- or single-card arrangement. The ejector levers and ejector lever brackets may be integral with portions of extender card 1 or may be discrete components that are attached to extender card 1. The method that may be used to attach card guides 3 and 4 to unitary card portion 2, connectors 5 and 6 to unitary card portion 2, ejector levers 7 and 8 to unitary card portion 2 or card guides 3 and 4, and ejector levers 9 and 10 to card guides 3 and 4 may be any suitable method or methods known in the art and appropriate to the specific implementation. Alternative embodiments of the invention include: an extender card arrangement having ejector levers on the unitary card portion; and an extender card arrangement having ejector lever brackets on the card guides. It is intended that the scope of the invention be defined by the claims appended hereto and their equivalents.

What is claimed is:

1. An extender card for use in a card cage, the extender card having upper and lower card guides attached to the rear upper and lower edges thereof, and extending rearward from a unitary card portion of the extender card, the unitary card portion having a rear connector for receiving the connector of a card under test via the card guides, and a front connector for insertion of the extender card into a card cage connector, the card under test having upper and lower ejector levers that mate with upper and lower ejector lever brackets on the card cage, said extender card comprising:

upper and lower extender card ejector levers attached to or integral with said unitary card portion upper and lower edges, respectively, and operated to mate with said upper and lower card cage ejector lever brackets to assist in the insertion and removal of said extender card front connector into and from said card cage connector; and upper and lower ejector lever brackets attached to or integral with said upper and lower card guides, respectively, and operated to mate with said card under test upper and lower card ejector levers to assist in the insertion and removal of said card under test connector into and from said extender card rear connector.

2. An extender card for use in a card cage, the extender card having upper and lower card guides attached to the rear upper and lower edges thereof, and extending rearward from a unitary card portion of the extender card, the unitary card portion having a rear connector for receiving the connector of a card under test via the card guides, and a front connector for insertion of the extender card into a card cage connector, the card under test having upper and lower ejector levers that mate with upper and lower ejector lever brackets on the card cage, said extender card comprising:

upper and lower extender card ejector levers attached to or integral with said unitary card portion upper and lower edges, respectively, and operated to mate with said upper and lower card cage ejector lever brackets to assist in the insertion and removal of said extender card front connector into and from said card cage connector.

* * * * *